(12) United States Patent
Chalom et al.

(10) Patent No.: US 8,826,926 B2
(45) Date of Patent: Sep. 9, 2014

(54) METHODS OF PROFILING EDGES AND REMOVING EDGE BEADS

(75) Inventors: Michael E. Chalom, Meridian, ID (US); Thomas U. Boettiger, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 637 days.

(21) Appl. No.: 13/153,834

(22) Filed: Jun. 6, 2011

(65) Prior Publication Data

US 2012/0305030 A1 Dec. 6, 2012

(51) Int. Cl.
*B08B 5/04* (2006.01)
*G03F 7/16* (2006.01)

(52) U.S. Cl.
CPC .. *B08B 5/04* (2013.01); *G03F 7/168* (2013.01)
USPC .................................. 135/21; 134/2; 134/18

(58) Field of Classification Search
None
See application file for complete search history.

(56) References Cited

U.S. PATENT DOCUMENTS

| | | | |
|---|---|---|---|
| 5,814,433 A | 9/1998 | Nelson et al. | |
| 5,952,050 A | 9/1999 | Doan | |
| 6,453,916 B1 | 9/2002 | Tran et al. | |
| 6,614,507 B2 | 9/2003 | Young et al. | |
| 6,786,996 B2 | 9/2004 | Emami | |
| 6,815,371 B2 | 11/2004 | Endisch | |
| 7,247,575 B2 | 7/2007 | Cheng et al. | |
| 7,328,713 B2 | 2/2008 | Kim | |
| 7,338,609 B2 | 3/2008 | Rolfson | |
| 7,470,344 B1 | 12/2008 | Doan | |
| 7,691,559 B2 | 4/2010 | Chang et al. | |
| 7,824,846 B2 | 11/2010 | Brodsky | |
| 2009/0082240 A1* | 3/2009 | Nukui et al. | 510/176 |
| 2009/0211604 A1 | 8/2009 | Winter et al. | |

* cited by examiner

*Primary Examiner* — Eric Golightly
(74) *Attorney, Agent, or Firm* — Wells St. John P.S.

(57) ABSTRACT

Some embodiments include methods for removing an edge bead after a photoresist application. Basic solution may be applied to the edge bead and removed with a vacuum, with the basic solution having a pH of at least about 14. Some embodiments include methods of profiling coatings along peripheral regions of substrates. A nozzle may be positioned above a peripheral region and oriented to direct a basic solution downwardly toward the peripheral region. A suction port may be positioned laterally outward of the peripheral region. Basic solution may be ejected from the nozzle toward the peripheral region, with the basic solution having a pH of at least about 14 and dissolving coating along the peripheral region. A vacuum may be provided within the suction port to pull the basic solution and the dissolved coating from the peripheral region.

6 Claims, 4 Drawing Sheets

US 8,826,926 B2

METHODS OF PROFILING EDGES AND REMOVING EDGE BEADS

TECHNICAL FIELD

Methods of profiling edges and removing edge beads.

BACKGROUND

A common technique for forming a pattern across a substrate is photolithography. Such comprises patterning actinic radiation across a photosensitive material (for instance, photoresist), and subsequently developing the photosensitive material to form a patterned mask. In subsequent processing, the patterned mask may be utilized during fabrication of components across the underlying substrate.

Photolithography may be utilized during fabrication of integrated circuitry by using a photomask or reticle to pattern the actinic radiation. Photolithography may also be used during fabrication of photomasks and reticles by using an electron beam, or other controlled form of actinic radiation. In applications in which photolithography is utilized during fabrication of integrated circuitry, the underlying substrate may be a semiconductor wafer (for instance, a monocrystalline silicon wafer); and in applications in which photolithography is utilized during fabrication of photomasks and reticles, the underlying substrate may be quartz or any other materials suitable for utilization in photomasks and reticles.

The term "photomask" is traditionally understood to refer to masks which define a pattern for an entirety of a wafer, and the term "reticle" is traditionally understood to refer to a patterning tool which defines a pattern for only a portion of a wafer. However, the terms "photomask" (or more generally "mask") and "reticle" are frequently used interchangeably in modern parlance, so that either term can refer to a radiation-patterning tool that encompasses either a portion or an entirety of a wafer. For purposes of interpreting this disclosure and the claims that follow, the terms "reticle" and "photomask" are utilized interchangeably to refer to radiation-patterning tools that define patterns across some or all of a wafer.

Difficulties may be encountered in attempting to uniformly disperse photosensitive material (for instance, photoresist) across an underlying substrate. For instance, photoresist may be applied to the underlying substrate by flowing liquid photoresist across a top surface of the substrate while the substrate is spinning. The liquid material spreads radially outward from a center of the substrate toward an edge of the substrate to coat a top of the substrate. Ideally, all excess photoresist would be ejected from the edge of the substrate. In practice, however, some excess photoresist tends to collect along the edge of the substrate and to form a bead along such edge (with the bead frequently be referred to as an "edge bead").

Various methods have been developed for removing edge beads, but such methods frequently produce unsatisfactory results. For instance, one method for removing edge beads is to utilize organic solvent to dissolve photoresist along the edge of the substrate, and to thereby dissolve the edge bead. Unfortunately, the photoresist may come out of solution as the solvent evaporates. Thus, the net effect may be that the edge bead is transferred from one location to another across the upper surface of the substrate, rather than being removed from such upper surface during utilization of solvent. It is desired to develop new methods for removing edge beads.

DETAILED DESCRIPTION OF THE ILLUSTRATED EMBODIMENTS

Some embodiments include utilization of strongly basic solutions to remove edge beads during photolithographic processing. A suitable strongly basic solution is a solution having a pH of at least about 14. The basic component of the solution may be any suitable base, and in some embodiments may comprise, consist essentially of, or consist of one or both of potassium hydroxide and tetramethyl ammonium hydroxide. Example embodiments are described with reference to FIGS. 1-6.

Figure 1:
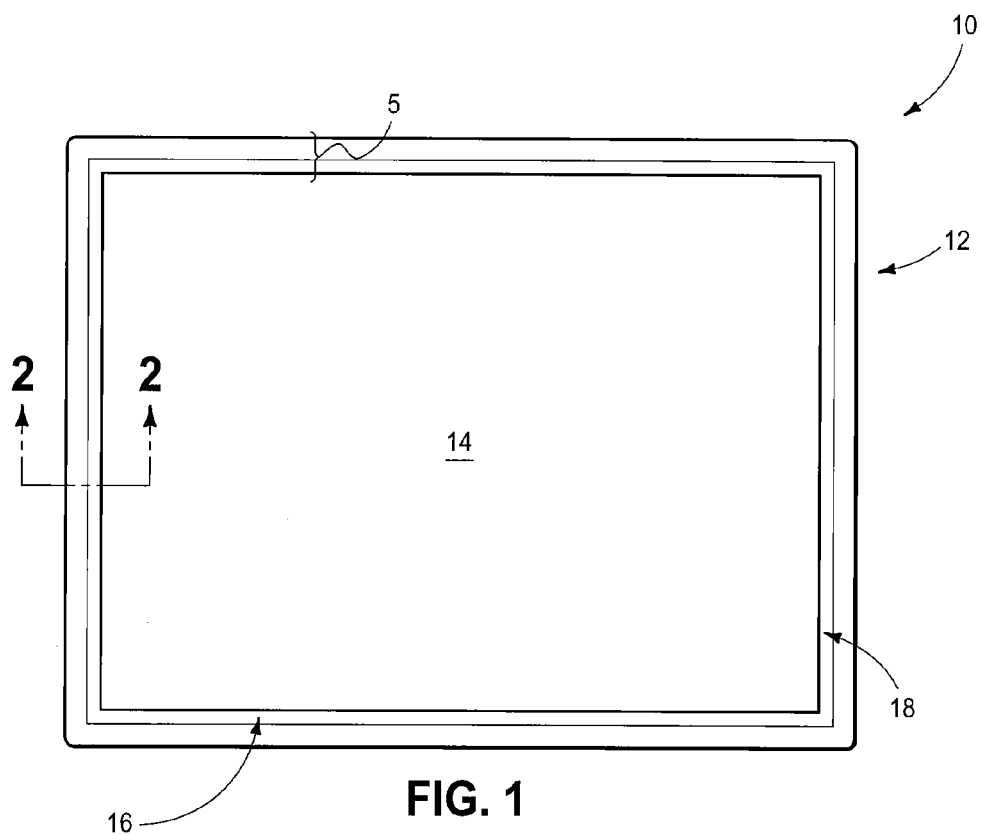
FIG. 1 is a diagrammatic top view of a photoresist-coated reticle, and shows an edge bead around a periphery of the reticle.
Figure 2:
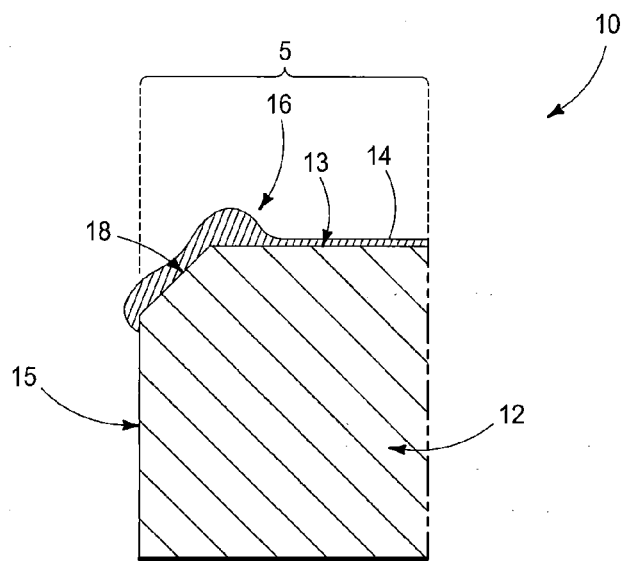
FIG. 2 is a diagrammatic, cross-sectional side view of a portion of the FIG. 1 reticle. The cross-section section of FIG. 2 is along the line 2-2 of FIG. 1.

Referring to FIGS. 1 and 2, a construction 10 is shown to comprise a substrate 12 having a coating 14 provided thereover. The substrate comprises an outer edge, and may be considered to comprise a peripheral region 5 along such edge. The coating 14 is uniformly distributed across most of an upper surface of substrate 12, except that there is a bead 16 of the coating along the peripheral region of the substrate.

The substrate has a top surface 13, and a lateral edge 15; and the illustrated substrate has a faceted corner 18 extending between the top surface and the lateral edge. The faceted corner 18 may be replaced with any other suitable corner in other embodiments.

The substrate 12 may comprise any suitable structure. For instance, the substrate may correspond to a partially-fabricated reticle; and thus may comprise, for example, a quartz base, either alone, or in combination with one or more of various opaque and/or half-tone features. In other embodiments, the substrate may correspond to a semiconductor substrate (for instance, a monocrystalline silicon wafer, or other semiconductor wafer) at a processing stage associated with fabrication of integrated circuitry; and thus may comprise the semiconductor substrate, either alone, or in combination with one or more of various conductive materials, insulative materials, and semiconductor materials.

The coating 14 may comprise a photosensitive coating, and in some embodiments may comprise, consist essentially of, or consist of photoresist. The photoresist may be any suitable photoresist, and, for example, may be positive photoresist or negative photoresist.

Figure 3:
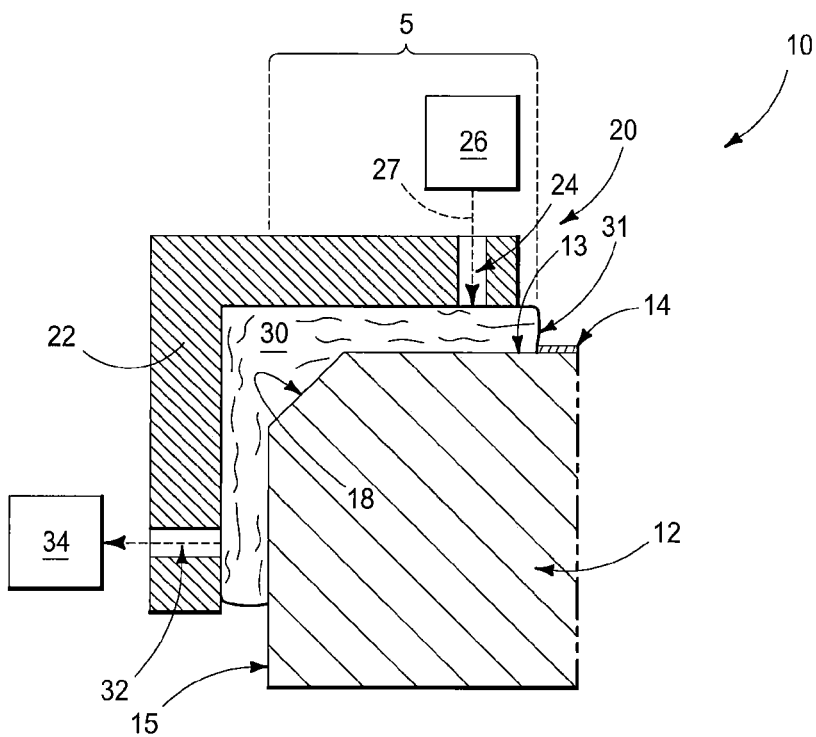
FIG. 3 is a diagrammatic, cross-sectional view of the reticle of FIG. 2 shown at a processing stage subsequent to that of FIG. 2 in accordance with an example embodiment method.

FIG. 3 illustrates an apparatus 20 that may be utilized for removing the edge bead 16 (FIGS. 1 and 2) in some embodiments. The apparatus comprises a retaining structure 22 that extends around a corner of substrate 12. The retaining structure has a nozzle 24 extending therethrough, with such nozzle being in fluid communication with a reservoir 26 of basic solution. The nozzle is oriented to dispense basic solution onto the peripheral region of the substrate. In the shown embodiment, the nozzle is above the top surface 13 of the substrate, and configured to eject the basic solution downwardly onto such top surface. In some embodiments, the nozzle may be directly over bead 16 (FIGS. 1 and 2). The ejection of basic solution through the nozzle is diagrammatically illustrated in FIG. 3 with an arrow 27.

The basic solution ejected from the nozzle comprises a pH of at least about 14, and in some embodiments comprises a pH of greater than or equal to 14. The basic solution may comprise any suitable basic components, and in some embodiments may comprise one or both of potassium hydroxide and tetramethyl ammonium hydroxide. The strongly basic characteristics of the solution may chemically react with photoresist and/or other coatings utilizing known chemistry to decompose such coatings and thereby dissolve the coatings. The basic solution may be advantageous for removing the coating relative to the solvents that had been used in prior art methods, in that the basic solution can chemically decompose the coating so that the coating is more effectively removed than is the case when the coating is simply dissolved in solvent. If the strongly basic characteristics of the solution are not enough by themselves to satisfactorily decompose a particular coating and dissolve the by-products, catalysts and/or other chemical components may be included in the solution to improve chemical removal of the coating.

The basic solution is illustrated in FIG. 3 as a solution 30 formed within a region between apparatus 20 and substrate 12. In some embodiments, the solution 30 may be referred to as being within an interfacial region between apparatus 20 and substrate 12.

The apparatus 20 also includes a suction port 32 which is positioned laterally outward of the edge 15 of substrate 12. The suction port is connected with a pump or other suitable device 34 which provides a vacuum within the suction port. Such a vacuum is utilized to pull solution 30 and any dissolved material of coating 14 off from the peripheral region 5 of the substrate. Thus, the illustrated apparatus simultaneously applies basic solution 30 to the upper surface of substrate 12 through nozzle 24, and removes the solution from such upper surface with a vacuum applied by suction port 32. If desired, the solution removed with the suction port may be passed through a trap to remove and/or reclaim various materials that may be dissolved in the solution.

The rate of removal of solution 30 from the peripheral region may be balanced relative to the flow rate of solution 30 onto the peripheral region so that an edge 31 of solution 30 is maintained at a desired location within the peripheral region 5 to achieve a desired profile of coating 14 along such peripheral region. In other words, a location of a meniscus of solution 30 may be maintained at a desired location over the upper surface 13 of substrate 12 through appropriate balance of the rate of flow of solution 30 onto the upper surface relative to the rate of removal of solution 30 from the upper surface.

The basic solution 30 may be applied to surface 13 of substrate 12 at any suitable temperature, and in some embodiments may be about room temperature (22° C.) as it is applied to such upper surface.

Although the illustrated apparatus 20 has a single nozzle 24 and a single suction port 32, in other embodiments analogous apparatuses may be configured to comprise more than one nozzle and/or more than one suction port. Also, although the illustrated apparatus 20 orients the nozzle 24 at about 90 degrees relative to the suction port 32, in other embodiments the nozzle may be oriented at a different angle relative to the suction port.

Figure 4:
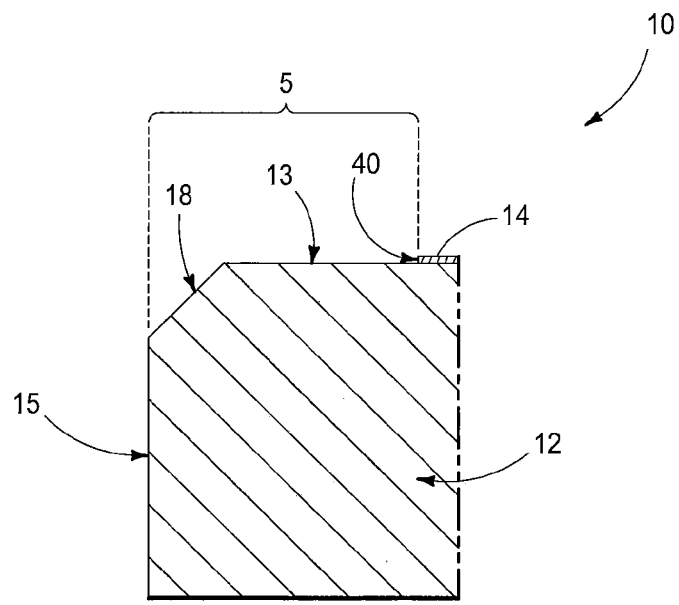
FIG. 4 is a diagrammatic, cross-sectional view of the reticle of FIG. 2 shown at a processing stage subsequent to that of FIG. 3 in accordance with the example embodiment method.

FIG. 4 shows construction 10 at a process stage subsequent to the utilization of apparatus 20 (FIG. 3), and shows that the basic solution 30 (FIG. 3) has been utilized to achieve a desired profile across the surface 13 of the substrate within the peripheral region 5. Specifically, in the shown embodiment the edge bead 16 (FIG. 2) has been entirely removed, and a clean edge 40 of coating material 14 has been formed along the peripheral region 5.

Figure 5:
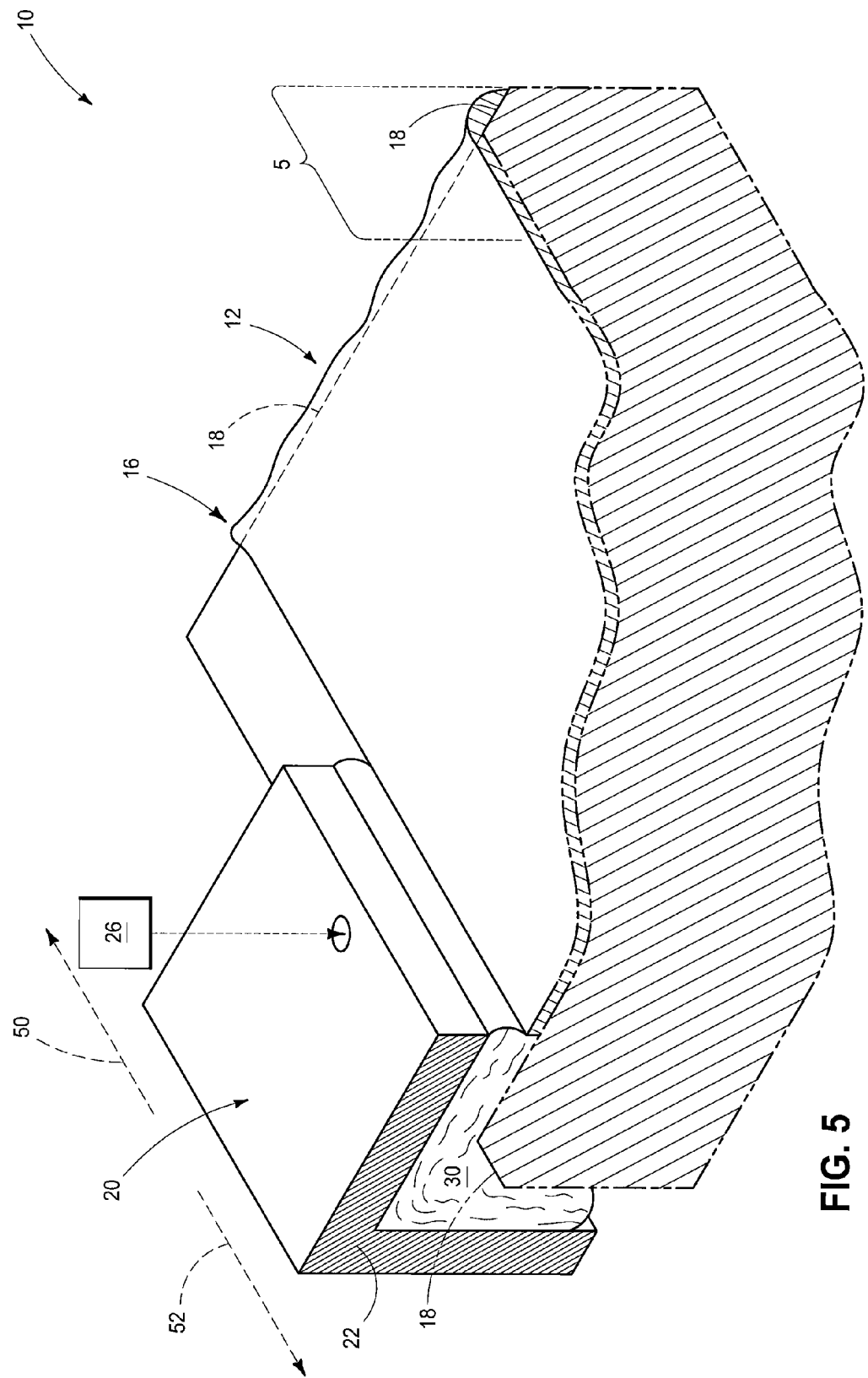
FIG. 5 is a diagrammatic, three-dimensional view of a reticle at a processing stage in accordance with an example embodiment method.

FIG. 5 illustrates an example method of operation of apparatus 20 relative to a construction 10 having an edge bead 16 which is to be removed. Specifically, the apparatus 20 may be moved back-and-forth along an edge of the construction (as illustrated by arrow's 50 and 52) until the edge bead is satisfactorily removed and a desired profile is formed along the peripheral region 5 proximate such edge. The apparatus may then be moved to a second edge, and the process repeated to form a desired profile along the second edge. Subsequently, the apparatus may be moved to a third edge (shown in FIG. 1, but not in FIG. 5), and then to a fourth edge (shown in FIG. 1, but not in FIG. 5) to create desired profiles along all of the edges of the construction 10. In other embodiments, multiple apparatuses 20 may be simultaneously utilized relative to a single construction 10 so that all of the edges may be simultaneously treated to form desired profiles along such edges. Although the illustrated construction of FIG. 1 is rectangular, in other embodiments other shapes of constructions may be utilized. For instance, the constructions may be other types of polygons, may be circular, may be oval, etc.

Figure 6:
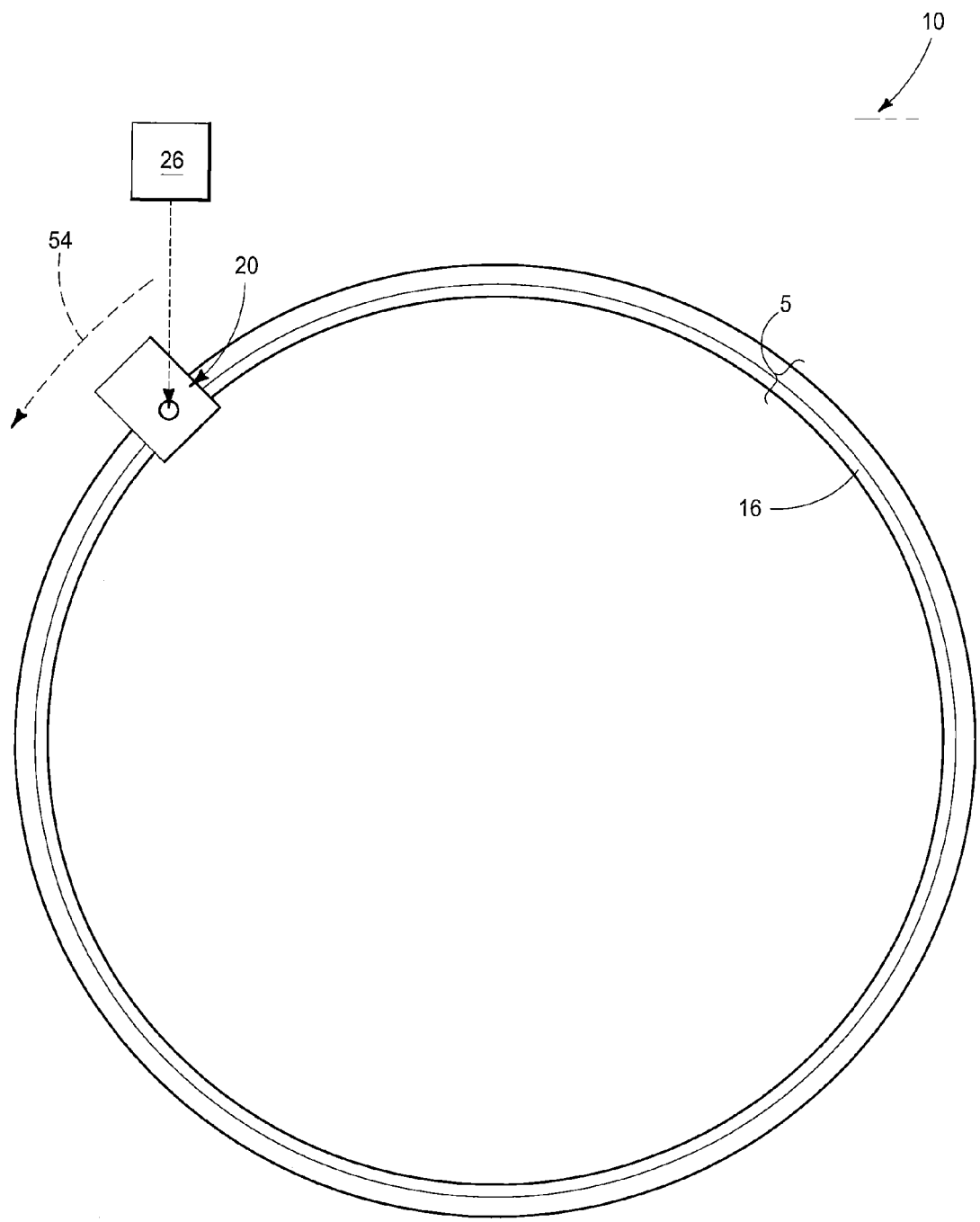
FIG. 6 is a diagrammatic top view of a photoresist-coated wafer shown at a processing stage of another example embodiment method.

FIG. 6 shows an apparatus 20 be utilized to remove an edge bead 16 along the peripheral region 5 of a circular construction 10. In the shown embodiment, the apparatus travels in a single direction around the outer periphery of the circular construction (as illustrated by the arrow 54). In other embodiments, the apparatus 20 may move back-and-forth along the edge of the circular construction. Also, although only one apparatus 20 is shown utilized relative to the circular construction of FIG. 6, in other embodiments there may be multiple apparatuses simultaneously utilized along the circular periphery of such construction.

The apparatuses 20 and/or constructions 10 of FIGS. 3, 5 and 6 may be connected to any suitable mechanical systems and circuitry to achieve desired movement of the apparatuses relative to the illustrated constructions.

Once a desired profile is achieved along the peripheral region of a construction utilizing a basic solution in accordance with the various embodiments discussed above, the construction may be cleaned with a deionized water rinse to remove any residual basic solution and/or byproducts of the reaction between the basic solution and the coating 14. The construction may then be subjected to suitable drying to remove the deionized water.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present.

In some embodiments, the invention includes a method for removing an edge bead after a photoresist application. The method comprises application of a basic solution to the edge bead while simultaneously removing the basic solution with a vacuum, with the basic solution having a pH of at least about 14.

In some embodiments, the invention includes a method for removing an edge bead of a coating material that has been spun onto the surface of a substrate. A basic solution is dispensed onto a peripheral region of the substrate to dissolve the coating material at the peripheral region of the substrate, with the basic solution having a pH of at least about 14. A suction is applied to the peripheral region of the substrate to remove the basic solution and the dissolved coating material from the peripheral region of the substrate.

In some embodiments, the invention includes a method of profiling a coating along a peripheral region of a substrate. At least one nozzle is positioned above the peripheral region and is oriented to direct a basic solution downwardly toward the peripheral region. At least one suction port is positioned laterally outward of the peripheral region. Basic solution is ejected from said at least one nozzle toward said peripheral region, with the basic solution having a pH of at least about 14 and dissolving coating along said peripheral region. A vacuum is provided within the at least one suction port to pull said basic solution and dissolved coating from said peripheral region.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of profiling a coating along a peripheral region of a substrate, comprising:

positioning at least one nozzle above the peripheral region and oriented to direct a basic solution downwardly toward said peripheral region;

positioning at least one suction port laterally outward of the peripheral region;

ejecting basic solution from said at least one nozzle toward said peripheral region, the basic solution having a pH of at least about 14 and dissolving coating along said peripheral region;

providing a vacuum within the at least one suction port to pull said basic solution and dissolved coating from said peripheral region;

wherein the at least one suction port and at least one nozzle extend through a retaining structure; and wherein a rate of removal of the basic solution achieved with the vacuum is balanced relative to a rate of flow through said at least one nozzle to maintain a meniscus edge of the basic solution at a location laterally outward of the retaining structure.

2. The method of claim 1 wherein the coating is photoresist.

3. The method of claim 2 wherein the substrate is a semiconductor wafer.

4. The method of claim 2 wherein the substrate is a reticle.

5. The method of claim 1 wherein:

said at least one nozzle is a single nozzle within the retaining structure, said at least one suction port is a single suction port within the retaining structure; and the retaining structure is configured to orient the nozzle at about 90 degrees relative to the suction port.

6. The method of claim 5 further comprising moving the retaining structure back and forth across various regions of the peripheral region multiple times to achieve a desired profile of the coating along the peripheral region.

* * * * *